US007244667B2

(12) United States Patent
Tillack et al.

(10) Patent No.: US 7,244,667 B2
(45) Date of Patent: Jul. 17, 2007

(54) METHOD AND DEVICE FOR THE PRODUCTION OF THIN EPITAXIAL SEMICONDUCTOR LAYERS

(75) Inventors: Bernd Tillack, Frankfurt an der Oder (DE); Dirk Wolansky, Frankfurt an der Oder (DE); Georg Ritter, Frankfurt an der Oder (DE); Thomas Grabolla, Arensdorf (DE)

(73) Assignee: IHP GmbH - Innovations for High Performance Microelectronics

( * ) Notice: Subject to any disclaimer, the term of this patent is extended or adjusted under 35 U.S.C. 154(b) by 208 days.

(21) Appl. No.: 10/484,975

(22) PCT Filed: Jul. 25, 2002

(86) PCT No.: PCT/EP02/08296

§ 371 (c)(1),
(2), (4) Date: Aug. 16, 2004

(87) PCT Pub. No.: WO03/012840

PCT Pub. Date: Feb. 13, 2003

(65) Prior Publication Data

US 2004/0266142 A1    Dec. 30, 2004

(30) Foreign Application Priority Data

Jul. 27, 2001 (DE) ................................. 101 37 441
Sep. 6, 2001 (DE) ................................. 101 44 431

(51) Int. Cl.
*H01L 21/205* (2006.01)
(52) U.S. Cl. ............................... 438/503; 257/E21.102
(58) Field of Classification Search ........ 257/E21.041, 257/E21.065, E21.102, E21.103; 438/478, 438/492, 503; 427/255.28
See application file for complete search history.

(56) References Cited

U.S. PATENT DOCUMENTS

| 5,294,572 | A |   | 3/1994  | Granneman et al. |
|-----------|---|---|---------|------------------|
| 5,298,452 | A |   | 3/1994  | Meyerson         |
| 5,303,671 | A |   | 4/1994  | Kondo et al.     |
| 5,380,682 | A | * | 1/1995  | Edwards et al. ............ 438/800 |
| 5,420,044 | A |   | 5/1995  | Kozuka           |
| 5,492,860 | A |   | 2/1996  | Ohkubo et al.    |
| 5,904,567 | A |   | 5/1999  | Yamazaki         |
| 6,013,134 | A | * | 1/2000  | Chu et al. .................. 118/715 |
| 6,037,272 | A |   | 3/2000  | Park et al.      |
| 6,410,975 | B1 | * | 6/2002 | Racanelli .................... 257/591 |
| 6,426,265 | B1 | * | 7/2002 | Chu et al. .................. 438/312 |
| 6,488,778 | B1 | * | 12/2002 | Ballantine et al. .......... 118/719 |

FOREIGN PATENT DOCUMENTS

| DE | 19652423    | 6/1998  |
|----|-------------|---------|
| DE | 10033940    | 7/2000  |
| EP | 0 267 082   | 10/1987 |
| EP | 0 717 435   | 11/1995 |
| EP | 10199870    | 7/1998  |
| EP | 0 961 313   | 5/1999  |
| EP | 1 039 512   | 3/2000  |
| EP | 1 039 512 A2 | 3/2000 |
| JP | 10199870 A  | 7/1998  |
| WO | WO 98/26457 | 6/1998  |
| WO | WO 00/12785 | 3/2000  |

OTHER PUBLICATIONS

Wolf et al., "Silicon Processing for the VLSI Era vol. 1: Process Technology," 2000, Lattice Press, pp. 128-132.*
Low temperature Si epitaxy in a vertical LPCVD batch reactor, G. Ritter, et al; Elsevier Science; 2000; Materials Science and Engineering B73 (2000) 203-207.
Low temperature chemical vapor deposition of epitaxial Si and SiGe layers at atmospheric pressure; W. B. deBoer, et al; American Institute of Physics, Mar. 25, 1991.
Kinetics of silicon-germanium deposition by atmospheric-pressure chemical vapor deposition; T. Kamina, et al; American Institute of Physics, Jul. 8, 1991.
Low temperature silicon epitaxy by ultrahigh vacuum/chemical vapor deposition; B.S. Meyerson; American Institute of Physics, Mar. 24, 1986.

(Continued)

*Primary Examiner*—Carl Whitehead, Jr.
*Assistant Examiner*—Jennifer M. Dolan
(74) *Attorney, Agent, or Firm*—Ware, Fressola, Van Der Sluys & Adolphson LLP

(57) ABSTRACT

System for producing diffusion-inhibiting epitaxial semiconductor layers, by means of which thin diffusion-inhibiting, epitaxial semiconductor layers can be produced on large semiconductor substrates at a high throughput.

The surfaces of the semiconductor substrates to be coated are first cleaned, and the substrates are then heated in a low pressure batch reactor to a first temperature (prebake temperature). The surfaces to be coated are next subjected to a hydrogen prebake operation at a first reactor pressure. In the next step the semiconductor substrates are heated in a low pressure hot or warm wall batch reactor to a second temperature (deposition temperature) lower than the first temperature, and after a condition of thermodynamic equilibrium is reached the diffusion-inhibiting semiconductor layers are deposited on the surfaces to be coated in a chemical gaseous deposition process (CVD) at a second reactor pressure higher than, equal to or lower than the first reactor pressure.

20 Claims, 2 Drawing Sheets

OTHER PUBLICATIONS

Growth Kinetics of Chemical Vapor Deposition of B-SiC from $(CH_3)_2SiCl_2/Ar$; T. Tago, et al; The Electrochemical Society, Inc.; vol. 145, No. 7; Jul. 1998.

Growth of heteroepitaxial $Si_{1-x-y}Ge_xC_y$ alloys on silicon using novel deposition chemistry; M. Todd, et al; American Institute of Physics; Aug. 28, 1995.

Single-crystalline, epitaxial cubic SiC films grown on (100) Si at 750 Celcius by chemical vapor depostion; I. Golecki, et al; American Institute of Physics; Apr. 6, 1992.

Structure and properties of rapid thermal chemical vapor deposited polycrystalline silicon-germanium films on $SiO_2$ using $Si_2H_6$ $GeH_4$ and $B_2H_6$ gases; American Institute of Physics; May 15, 1998.

* cited by examiner

METHOD AND DEVICE FOR THE PRODUCTION OF THIN EPITAXIAL SEMICONDUCTOR LAYERS

CROSS REFERENCE TO RELATED APPLICATIONS

This application is for entry into the U.S. national phase under 371 for International Application No. PCT/EP02/08296 having an international filing date of Jul. 25, 2002, and from which priority is claimed, and which in turn claims priority from German Patent Application No. DE 101 37 441.0 filed on Jul. 27, 2001, and German Patent Application No. DE 101 44 431.0 filed on Sep. 6, 2001.

TECHNICAL FIELD

The invention concerns a method and devices for the production of thin, preferably diffusion-inhibiting, epitaxial semiconductor layers.

BACKGROUND ART

Epitaxially deposited semiconductor layers, preferably of SiGe or Si, involving high and sharply delimited dopings, are increasingly used in the production of high frequency devices such as for example 1-heterobipolar transistors (HBT) and in CMOS circuits. Those highly doped layers involve the problem of diffusing out during subsequent process steps at elevated temperatures within the technological procedures involved and thus degradation of the electronic properties of those layers. In order to minimize those diffusion processes the temperatures have to be reduced and additional diffusion-inhibiting materials have to be employed.

WO 98/26457 describes how the diffusion of boron in SiGe is significantly suppressed by the use of an additional, electrically non-active material, preferably an element from the 4th main group, in particular carbon, in a concentration of between $10^{18}$ cm$^{-3}$ and $10^{21}$ cm$^{-3}$. The production of those epitaxial diffusion-inhibiting layers, preferably of SiGeC or SiC, is effected by molecular beam epitaxy (MBE) and primarily with chemical gaseous phase deposition (CVD) processes. As described in T. I. Kamins, D. J. Meyer, Appl. Phys. Lett., 59, (1991) 178; W. B. de Boer, D. J. Meyer, Appl. Phys. Lett. 58, (1991) 1286 and B. S. Meyerson, Appl. Phys. Lett. 48 (1986) 797, single-wafer and ultra-high-vacuum (UHV) batch reactors are used in conjunction with CVD processes. In the case of the single-wafer reactors, it can be detrimentally observed that those installations do not involve hot wall reactors, in other words in single-wafer reactors the wafers are very rapidly heated by means of radiant or induction heating, in which case neither the wafer nor the reactor goes into a condition of thermodynamic equilibrium.

Because of the necessary low deposition rates in the case of Si-, SiC-, SiGe- and SiGeC-low temperature epitaxy, only a low throughput rate is to be achieved with single-wafer reactors. For typical HBT stacks the throughput rate is for example about 5 wafers per hour. That is not economically viable for an industrial process.

The sole batch reactor which has been known hitherto is an UHV hot wall reactor which operates in the temperature range of between 400° C. and 800° C. and typically at 600° C. In those hot wall reactors the wafers are heated in small batches in a condition of thermodynamic equilibrium, whereby it is admittedly possible to achieve a substantially better level of temperature homogeneity, but the high expenditure linked to the UHV process has a disadvantageous effect on the throughput rate. Thus, all peripheral process times (for example pumping and flushing sequences, handling of the wafers and so forth) are substantially longer than for example with conventional low pressure (LPCVD) installations. Therefore, the throughput rate for typical HBT stacks in the case of that UHV batch reactor is in the range of the single-wafer reactors, that is to say about 5 wafers per hour. There is also the disadvantageous effect that, because of the UHV system, it is not possible to use very high temperatures (1000° C. and higher) and thus for example in the UHV batch reactor etching and baking processes can only be implemented at low temperatures. The low H$_2$O/O$_2$ residual content for low temperature epitaxy, which is achieved for UHV installations and which is represented as necessary, can also be achieved by suitable measures for non-UHV installations.

Low pressure (LP) batch reactors were hitherto not used for the production of diffusion-inhibiting semiconductor layers, in particular not those of SiGeC or SiC. The reason for this is on the one hand the fact that the low oxygen and moisture content required by the men skilled in the art for low temperature epitaxy in those installations was deemed not to be a feasible proposition. On the other hand, depletion effects occur in the gaseous phase in high temperature epitaxy in the batch reactors, and those effects result in inadequate homogeneity of the deposited layers on the substrates. Therefore single wafer reactors have gained general acceptance for high temperature epitaxy (T≧1000° C.). At low temperatures however kinetic effects dominate and transport-conditioned depletion is of subordinate significance in comparison with the influence of temperature homogeneity on layer homogeneity.

DISCLOSURE OF THE INVENTION

The object of the invention is to propose a method and a device, by means of which thin and in particular thin diffusion-inhibiting epitaxial semiconductor layers can be produced on large semiconductor substrates which are usual in the semiconductor art, at a high throughput rate which is suitable for industrial production for typical HBT stacks. The invention further seeks to provide that methods and devices are to guarantee the necessary technological conditions such as homogenous temperature distribution at a suitable operating temperature and the necessarily low residual content of oxygen and moisture.

In accordance with the invention that object is attained in that firstly the surfaces to be coated of the semiconductor substrates are cleaned by per se known procedures in a wet chemical process and/or in the gaseous phase. Suitable procedures for that purpose are for example a Piranha/SC1/SC2/HF-dip/DI-rinse procedure, a Piranha/SC1/SC2 procedure and/or an HF vapor clean procedure.

The cleaned semiconductor substrates are then heated in a low pressure batch reactor to a first temperature (prebake temperature) which is higher than the following method step and, to eliminate oxide from the air and other impurities, the surfaces to be coated are subjected to a hydrogen prebake at a reactor pressure which is equal to or higher than the following method step.

In the following method step the semiconductor substrates pretreated in that way are heated in a low pressure hot or warm wall batch reactor to a second temperature (deposition temperature) lower than the preceding method step and, after attainment of thermodynamic equilibrium, the thin, preferably diffusion-inhibiting, semiconductor layers are deposited on the surfaces to be coated in a chemical gaseous deposition process (CVD) at a reactor pressure which is equal to or lower than the preceding method step. In that respect the CVD process takes place under such conditions that the deposition is controlled by surface reactions on the substrate and thus gas transport in the low pressure hot or warm wall batch reactor is of subordinate significance. Those conditions are in particular a low temperature and/or a low reactor pressure.

The hydrogen prebake step is preferably effected at a temperature in the range of between 750 and 1100° C. and at a gas pressure in the range of between 0.1 and 760 torr and epitaxial deposition of the preferably diffusion-inhibiting semiconductor layer is preferably effected at a temperature in the range of between 450 and 800° C. and at a gas pressure in the range of between 0.1 and 100 torr. Particularly preferred process parameters are set forth in the appendant claims.

It has been found that the specified method steps and in particular the specified method parameters make it possible to achieve thin layers of adequate homogeneity. The invention is based on the realization that adequate homogeneity of the layers is critical precisely in relation to thin layers, in which respect the requirements in terms of a high throughput rate and a high level of homogeneity are contradictory. As the diffusion of foreign atoms such as dopants into thin layers is of relatively greater significance than in the case of thicker layers, a preferred method is one in which a plurality of layers are produced, of which at least one thin layer is of diffusion-inhibiting nature.

Implementation of the method for the production of the thin, diffusion-inhibiting layer is preferably effected in such a way that an electrically inert, diffusion-inhibiting element such as carbon is substantially substitutionally introduced into the corresponding semiconductor layer by epitaxial layer growth. The concentration achieved in that way of preferably substitutional carbon is preferably less than 1 atomic % or less than $5*10^{20}$ cm$^{-3}$. The particularly preferred concentration range is between $1*10^{20}$ and $5*10^{20}$ cm$^{-3}$.

By way of example methyl silane is suitable as the carbon source for the production of diffusion-inhibiting epitaxial semiconductor layers, preferably on the basis of SiGeC or SiC.

The method according to the invention provides that, for the epitaxial deposition of the diffusion-inhibiting semiconductor layers modified hot wall low pressure batch reactors can be used for the chemical gaseous phase deposition procedure (LPCVD batch reactors), by means of which the throughput rate can be increased to about 75 wafers per hour for typical HBT stacks. A crucial point in terms of applicability of the LPCVD batch reactors for low temperature epitaxy is a preceding high temperature process step in the form of a hydrogen prebake, whereby air oxide and other impurities are eliminated. In the following low temperature process step, epitaxial deposition of the diffusion-inhibiting semiconductor layers takes place out of the gaseous phase. The procedure according to the invention can both be implemented in such a way that the high temperature and the low temperature process steps are performed in a single LPCVD batch reactor equipped for that purpose, and also in such a way that two separate batch reactors are used for that purpose, which are connected by way of a transfer chamber with integrated inert gas flushing and/or a vacuum environment. Depending on the respective factors involved therefore it is possible to achieve a further increase in the throughput rate without having to tolerate technological losses. The method according to the invention avoids the disadvantageous influences which can occur as a consequence of an excessively high oxygen and moisture content and as a consequence of the occurrence of depletion effects. In addition, further high temperature treatments such as reactor etching and baking processes are also possible in that manner within the installation.

The devices described for carrying out the methods correspond in their main components, in particular the automatic handling system, the quartz reactor in a resistance-heated heating cassette, the gas supply, the vacuum system and so forth, to modern LPCVD batch reactors. The installation additionally requires a transfer chamber system with integrated gas flushing and/or with integrated vacuum system, which makes it possible to maintain an inert gas or vacuum environment, preferably (in the case of inert gas flushing) using nitrogen with a low residual oxygen content (<20 ppm). In that respect the transfer chamber system serves in one embodiment for the introduction and discharge of the semiconductor substrates and in another embodiment it additionally serves for the transfer of the semiconductor substrates from one reactor to the other. Handling of the semiconductor substrates is therefore effected in an inert atmosphere and/or in a vacuum. Besides implementation of the actual deposition processes, the entire device is also suitable for the hydrogen treatment operations at temperatures of between 750° C. and 1100° C., at a pressure of between 0.1 and 760 torr and with a hydrogen flow of between 1 and 200 standard liters per minute. Alternatively there is provided a second reactor system which is integrated into the main system and which performs that function. The two reactors are connected by way of the above-described transfer chamber system to integrated inert gas flushing and/or to an integrated vacuum system.

BRIEF DESCRIPTION OF THE DRAWINGS

Besides being set forth in the claims the features of the invention are also set forth in the description and the drawings, in which respect the individual features each in themselves or in pluralities in the form of sub-combinations represent patentable configurations in respect of which protection is claimed here. Embodiments of the invention are illustrated in the drawings and are described in greater detail hereinafter. In the accompanying drawings:

DETAILED DESCRIPTION OF THE INVENTION

Example 1

Figure 1:
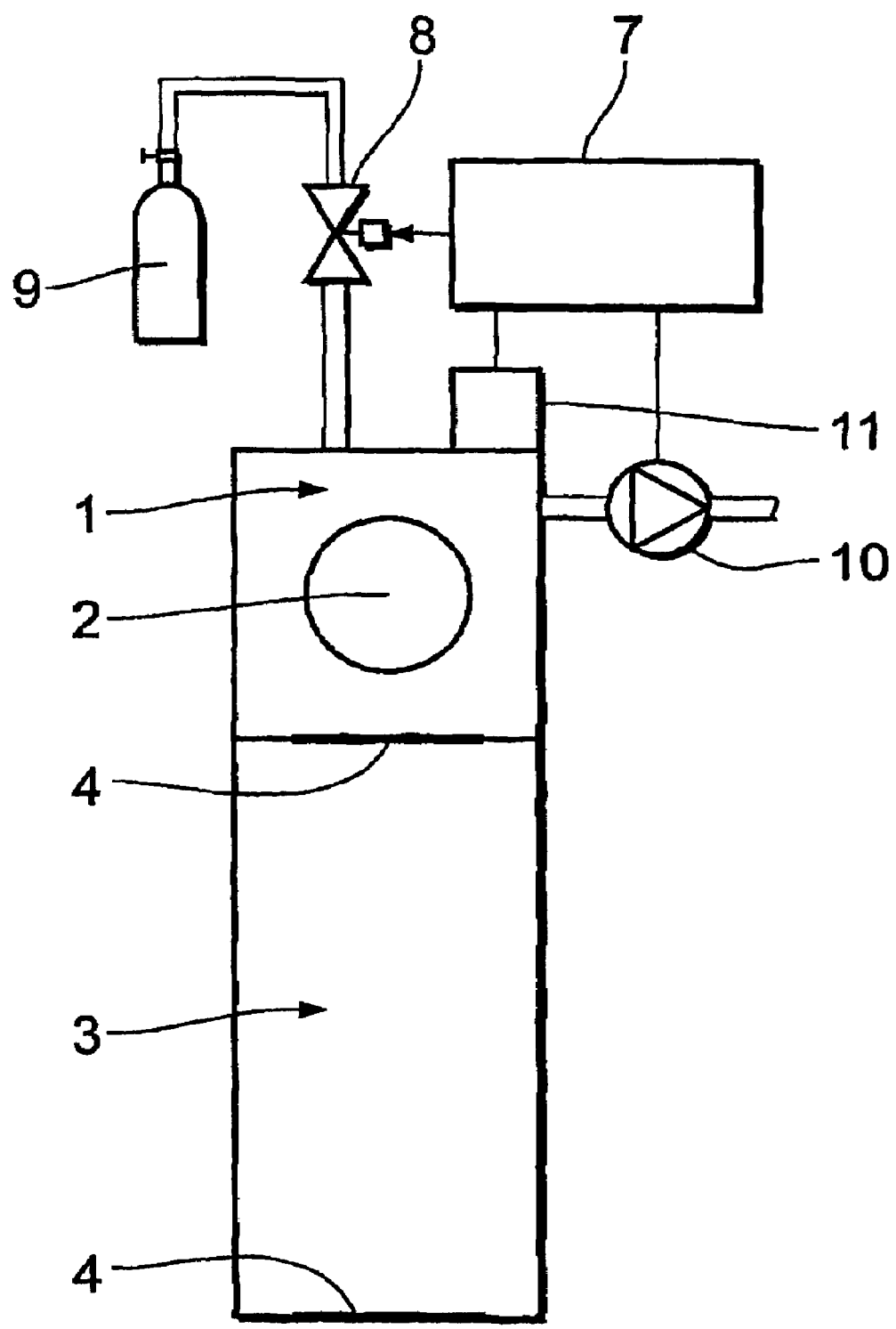
FIG. 1 is a diagrammatic view of a low pressure batch reactor with transfer chamber.

FIG. 1 shows a low pressure batch reactor for chemical gaseous phase deposition, for deposition of the thin in particular diffusion-inhibiting semiconductor layers. In this embodiment the device according to the invention comprises a main chamber 1 which contains a low pressure batch reactor 2, a transfer chamber 3 arranged at the main chamber 1 and a sealingly closing door 4 which is arranged therebetween, as well as a further, sealingly closing door 4 for stocking the transfer chamber 3. The main chamber 1 has devices for inert gas flushing and/or for producing a vacuum and devices for introducing gases into the low pressure batch reactor 2; those devices include one or more gas sources 9 which are connected to the main chamber 1 by way of a controllable valve 8. A vacuum pump 10 is also connected to the main chamber 1. To control the inert gas flushing operation, the introduction of gases and production of the vacuum, the valves 8 (of which only one is shown by way of example) and the vacuum pump 10 are connected to a control device 7. In accordance with the invention, a low pressure reactor 2, for the deposition of semiconductor layers out of the gaseous phase, is supplemented by conventional devices which make it possible in particular to implement high temperature process steps at up to 1100° C. In this embodiment the low pressure batch reactor 2 is a quartz reactor in a heating cassette which in particular is resistance-heated. A corresponding heating arrangement 11 is also connected to the control device 7.

Immediately after the wet-chemical operation of pre-cleaning the semiconductor substrates, for which purpose for example a Piranha/SC1/SC2/HF-dip/DI-procedure is used, the semiconductor substrates are introduced into the nitrogen-flooded transfer chamber 3 of the LPCVD installation. They remain there until a sufficiently low residual content of oxygen and moisture is achieved in the atmosphere of the transfer chamber 3. After transposition of the substrates out of the transport containers into the reactor boat it is introduced into the low pressure batch reactor 2.

In that case, a reduced temperature at a level of for example 400° C. obtains in the low pressure batch reactor 2. There then follows a CVD-typical sequence of process steps which primarily differ in respect of temperature, pressure and gas atmosphere.

After a stabilization phase the low pressure batch reactor 2 is set in respect of temperature and pressure to values which correspond to the conditions of the hydrogen prebake step which now follows (for example 850° C. and 50 torr). The prebake operation is started by heating the wafers to the corresponding prebake temperature in a hydrogen flow of between 1 and 200 standard liters per minute, in this embodiment about 200 standard liters per minute.

After the temperature is reduced to a second lower temperature value, for example 600° C. at 200 mtorr, including the necessary stabilization times for attaining thermodynamic equilibrium, the actual operation of deposition of the diffusion-inhibiting semiconductor layers is effected by introducing the appropriate process gases into the low pressure batch reactor 2. Preferably a mixed gas comprising hydrogen and for example $SiH_4$ or $SiH_2Cl_2$ and $GeH_4$ is used for that purpose. Preferably methyl silane is used as the carbon source. In this embodiment the semiconductor layers contain SiGe and/or Si and, as a diffusion-inhibiting material which significantly suppresses the diffusion of doping substances in Si and/or SiGe, an electrically non-active element, preferably from the 4th or 6th main group, in this embodiment carbon. The carbon significantly suppresses in particular transient enhanced diffusion (TED) of boron in the SiGe. Oxygen or a combination of carbon and oxygen is also suitable as a diffusion-inhibiting material.

Once again different process-governed temperature and pressure change operations can take place between the deposition of the individual layers.

After the conclusion of all deposition processes the low pressure batch reactor 2 is flushed clear; the temperature is reduced and the pressure is equalized in the low pressure batch reactor 2 and in the transfer chamber 3. The procedure is concluded with unloading of the substrates.

This method according to the invention permits a throughput rate of more than 25 wafers per hour for a typical HBT stack.

Example 2

Figure 2:
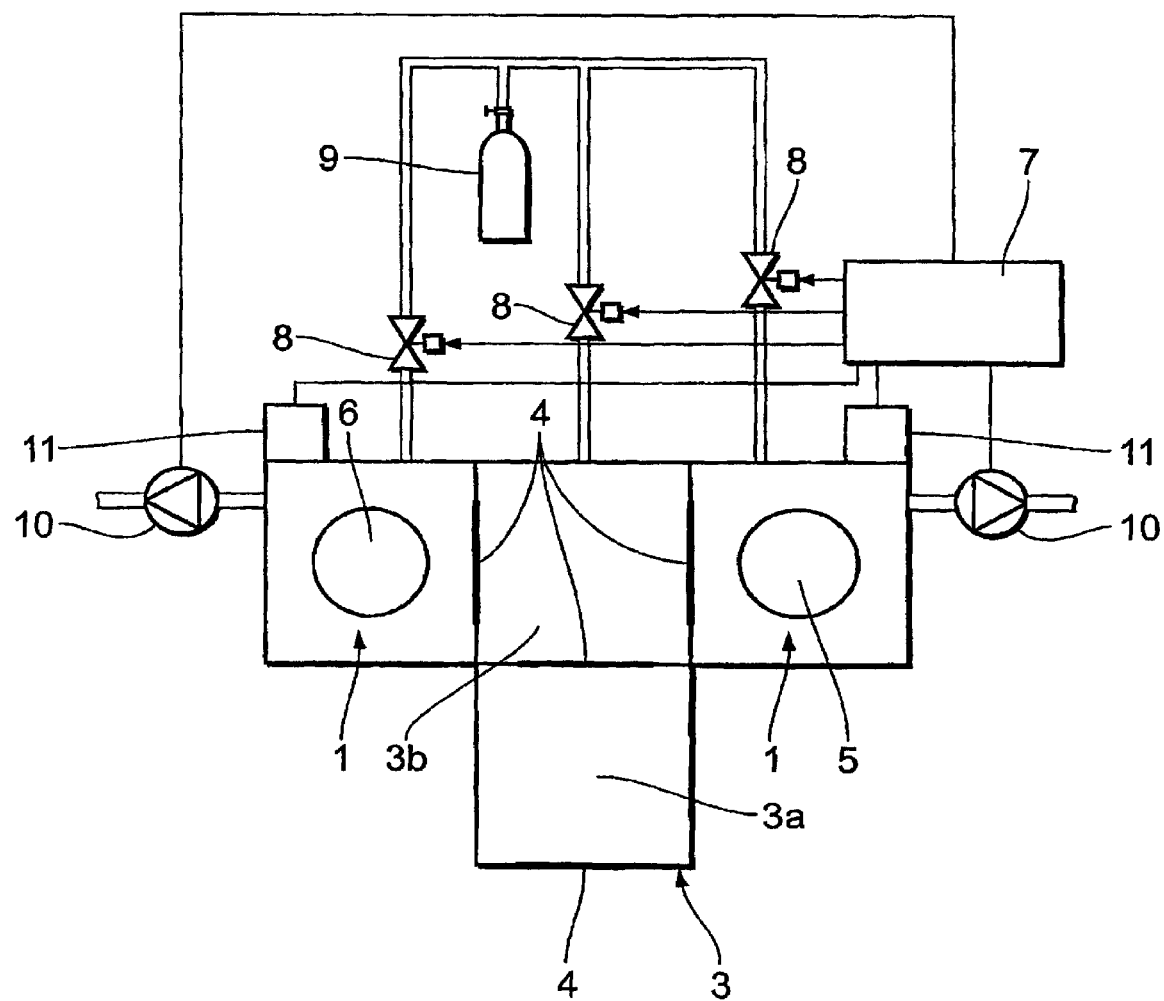
FIG. 2 is a diagrammatic view of two reactors connected by a transfer chamber.

FIG. 2 shows a variant of the reactor system according to the invention, comprising two main chambers 1 and a transfer chamber 3 arranged between the main chambers 1, wherein the main chambers 1 and the transfer chamber 3 are connected by sealingly closing doors 4 and the transfer chamber 3 can be stocked through such a door 4. The transfer chamber 3 also has an entry lock arrangement 3a, by way of which the transfer chamber 3 is to be stocked. A transfer between the two main chambers 1 is effected later in a transfer region 3b of the transfer chamber 3, which is then sealed off with respect to the entry lock arrangement 3a by a sealingly closing door 4. A low pressure batch reactor 5 and a low pressure hot or warm wall batch reactor 6 are further arranged in different main chambers 1. The main chambers 1 have devices for inert gas flushing and/or for producing a vacuum as well as devices for the introduction of gases into the low pressure batch reactor 5 and into the low pressure hot or warm wall batch reactor 6. Those devices include gas sources 9 which are connected to the respective main chamber 1 by way of controllable valves 8. The arrangement further has a respective heating means 11 and a vacuum pump 10. The controllable valves 8, the vacuum pumps 10 and the heating means 11 are respectively connected to process controls 7 which are of a suitable configuration for carrying out the method described herein. In accordance with the invention the low pressure batch reactor 5, for the deposition of semiconductor layers out of the gaseous phase, is supplemented by conventional devices which make it possible in particular to implement high temperature process steps at up to 1100° C. In this embodiment the low pressure batch reactor 5 and/or the low pressure hot or warm wall batch reactor 6 are quartz reactors in a respective heating cassette which in particular is resistance-heated.

The hydrogen prebake operation and epitaxial deposition of the diffusion-inhibiting semiconductor layers are effected in this embodiment in separate reactors as shown in FIG. 2. For that purpose, after conclusion of the hydrogen prebake operation, the semiconductor substrates are transferred from the first low pressure batch reactor 5 by way of the transfer region 3b of the transfer chamber 3 with the integrated inert gas flushing means into the second low pressure hot or warm wall batch reactor 6. That makes it possible to achieve an increased throughput rate. With this mode of operation, the technical demands made on the two batch reactors 5, 6 are lower. In this case also, the required times for stabilization of the ambient atmosphere in the transfer chamber 3 and in the second low pressure hot or warm wall batch reactor 6 are to be observed in accordance with the method according to the invention as discussed herein. In addition the low pressure batch reactor 5, the low pressure hot or warm wall batch reactor 6 and at least the transfer region 3b of the transfer chamber 3 must have a low moisture partial pressure.

Both the embodiments have a control 7 which is not shown in detail herein and which terminates a respective deposition process when a predetermined layer thickness of between 10 and 1000 nm is attained for the respective semiconductor layer. For the production of thin, diffusion-inhibiting semiconductor layers, the reactors 2 and 5 respectively also have devices 8 and 9 for the introduction of gases into the low pressure batch reactors 2 or 5 and a control device 7 which is connected thereto and which is adapted for the introduction of methyl silane in a predetermined dosage.

The control device 7 is also connected to a vacuum pump 10 for evacuation of the reactors 2 or 5 and to a heating means 11 for producing the required process temperatures. The desired process pressures can also be set by the control device 7, by means of the vacuum pump 10 and the devices 8 and 9 for the introduction of gases. The devices 8 and 9 for the introduction of gases may for example include one or more gas bottles 9 and a corresponding number of controllable valves 8.

In the present description a method for the production of diffusion-inhibiting semiconductor layers and devices for carrying out that method have been described by reference to specific embodiments by way of example. It should be noted however that the present invention is not limited to the details of the description in the embodiments by way of example as modifications and alterations are claimed within the scope of the claims.

What is claimed is:

1. A method for the production of thin epitaxial semiconductor layers, characterized in that:
   a) there are provided a plurality of semiconductor substrates of a diameter of at least 150 mm and having surfaces to be coated, for simultaneous treatment in a low pressure batch reactor (5),
   b) the surfaces to be coated of the semiconductor substrates are cleaned by a wet chemical process or in the gaseous phase or both,
   c) the cleaned semiconductor substrates are heated together in the low pressure batch reactor (5) to a first temperature (prebake temperature) and the surfaces to be coated are subjected together to a hydrogen prebake operation at a first reactor pressure,
   d) the semiconductor substrates are transferred together from the low pressure batch reactor (5) into a low pressure hot or warm wall batch reactor (6) in an inert atmosphere or in a vacuum or both after the hydrogen prebake operation,
   e) the semiconductor substrates are heated in the low pressure hot or warm wall batch reactor (6) to a second temperature (deposition temperature) lower than the first temperature (prebake temperature), and after attainment of a condition of thermodynamic equilibrium the semiconductor layers are deposited on the surfaces to be coated in a chemical gaseous deposition (CVD) process at a second reactor pressure equal to or lower than the first reactor pressure, and
   f) the CVD process is effected under such conditions that deposition is controlled by surface reactions on the substrate and thus gas transport in the low pressure hot or warm wall batch reactor (6) is of subordinate significance,
   g) wherein the deposition of a semiconductor layer is controlled in such a way that deposition of a thin epitaxial semiconductor layer ends when the thin epitaxial semiconductor layer has reached a predetermined thickness of between 10 nm and 1000 nm.

2. A method as set forth in claim 1, wherein the semiconductor layers may be the same or different materials.

3. A method as set forth in claim 1 characterized in that at least one of the semiconductor layers produced is a diffusion-inhibiting semiconductor layer so as to inhibit the diffusion of foreign atoms into any of the layers.

4. A method as set forth in claim 3 characterized in that introduced into the thin diffusion-inhibiting layer is a diffusion-inhibiting material for suppressing the diffusion of doping substances in Si or SiGe or both and in that the material used as the diffusion-inhibiting material is electrically non-active.

5. A method as set forth in claim 4 characterized in that the diffusion-inhibiting material is carbon.

6. A method as set forth in claim 5 characterized in that the carbon diffusion-inhibiting layer is deposited out of the gaseous phase and methyl silane is used as the carbon source.

7. A method as set forth in claim 4 characterized in that the diffusion-inhibiting material is oxygen.

8. A method as set forth in claim 4 characterized in that the diffusion-inhibiting material is an element that is present in the semiconductor layer substitutionally in a concentration of between $1*10^{20}$ and $5*10^{20}$ cm$^{-3}$.

9. A method as in claim 4, further characterized by controlling the deposition process so that the thin diffusion-inhibiting layer has a concentration of the diffusion-inhibiting material of between $1*10^{18}$ cm$^{-3}$ and $1*10^{21}$ cm$^{-3}$.

10. A method as set forth in claim 1 characterized in that the conditions under which the CVD process takes place are a low temperature or a low reactor pressure or both.

11. A method as set forth in claim 1 characterized in that the hydrogen prebake operation is effected at a temperature in the range of between 750 and 1100° C. and at a gas pressure in the range of between 0.1 and 760 torr and in that epitaxial deposition of the diffusion-inhibiting semiconductor layer is effected at a temperature in the range of between 450 and 800 20 C. and at a gas pressure in the range of between 0.1 and 100 torr.

12. A method as set forth in claim 11 characterized in that the hydrogen prebake operation is effected at a temperature in the range of between 900 and 1000° C.

13. A method as set forth in claim 11 characterized in that the hydrogen prebake operation is performed at a gas pressure in the range of between 0.5 and 1 torr.

14. A method as set forth in claim 11 characterized in that epitaxial deposition of the diffusion-inhibiting semiconductor layer is effected at a temperature in the range of between 600 and 700° C., and at a gas pressure in the range of between 0.3 and 1 torr.

15. A method as set forth in claim 1 characterized in that in the CVD process SiH$_4$ or SiH$_2$Cl$_2$ and GeH$_4$ is used as a mixed gas on a hydrogen basis.

16. A method as set forth in claim 1 characterized in that the hydrogen prebake operation is effected at a gas through flow rate of between 1 and 200 standard liters/minute.

17. A method as set forth in claim 1 characterized in that wet-chemical cleaning of the surfaces to be coated is effected in accordance with a Piranha/SC1/SC2HF-dip/DI-rinse procedure or in accordance with a Piranha/SC1/SC2 procedure or both.

18. A method as set forth in claim 1 characterized in that wet-chemical cleaning of the surfaces to be coated is effected in accordance with an HF vapor clean procedure.

19. A method as set forth in claim 1 characterized in that the semiconductor layers contain SiGe or Si or both.

20. An apparatus for the production of thin epitaxial semiconductor layers, comprising:
   a) means for receiving a plurality of semiconductor substrates of a diameter of at least 150 mm and having surfaces to be coated, for simultaneous treatment in a low pressure batch reactor (5),
   b) means for cleaning the surfaces by a wet chemical process or in the gaseous phase or both, c) means for heating the cleaned semiconductor substrates together in the low pressure batch reactor (5) to a first temperature (prebake temperature) and for subjecting the surfaces to be coated together to a hydrogen prebake operation at a first reactor pressure, d) means for transferring the semiconductor substrates together from the low pressure batch reactor (5) into a low pressure hot or warm wall batch reactor (6) in an inert atmosphere or in a vacuum or both after the hydrogen prebake operation, e) means for heating the semiconductor substrates in the low pressure hot or warm wall batch reactor (6) to a second temperature (deposition temperature) lower than the first temperature (prebake temperature), and after attainment of a condition of thermodynamic equilibrium depositing the semiconductor layers on the surfaces to be coated in a chemical gaseous deposition (CVD) process at a second reactor pressure equal to or lower than the first reactor pressure, and f) means for effecting the CVD process under such conditions that deposition is controlled by surface reactions on the substrate and thus gas transport in the low pressure hot or warm wall batch reactor (6) is of subordinate significance, g) wherein the deposition of a semiconductor layer is controlled in such a way that deposition of a thin epitaxial semiconductor layer ends when the thin epitaxial semiconductor layer has reached a predetermined thickness of between 10 nm and 1000 nm.

\* \* \* \* \*

UNITED STATES PATENT AND TRADEMARK OFFICE
CERTIFICATE OF CORRECTION

PATENT NO.        : 7,244,667 B2                                    Page 1 of 1
APPLICATION NO.   : 10/484975
DATED             : July 17, 2007
INVENTOR(S)       : Tillack et al.

It is certified that error appears in the above-identified patent and that said Letters Patent is hereby corrected as shown below:

1. In column 8, line 30, claim 11, line 7, "80020" should be --800°--.
2. In column 8, line 52, claim 17, line 3, "SC1/SC2HF" should be --SC1/SC2/HF--.

Signed and Sealed this

Twenty-ninth Day of April, 2008

JON W. DUDAS
*Director of the United States Patent and Trademark Office*